United States Patent
Monzel, III et al.

(10) Patent No.: US 6,864,716 B2
(45) Date of Patent: Mar. 8, 2005

(54) RECONFIGURABLE MEMORY ARCHITECTURE

(75) Inventors: Carl Anthony Monzel, III, Lakeville, MN (US); Michael Dillon, Richfield, MN (US); Bret Alan Oeltjen, Elko, MN (US)

(73) Assignee: LSI Logic Corporation, Milpitas, CA (US)

( * ) Notice: Subject to any disclaimer, the term of this patent is extended or adjusted under 35 U.S.C. 154(b) by 92 days.

(21) Appl. No.: 10/457,138

(22) Filed: Jun. 9, 2003

(65) Prior Publication Data

US 2004/0246023 A1 Dec. 9, 2004

(51) Int. Cl.[7] .......................................... H03K 19/177
(52) U.S. Cl. ........................... 326/47; 356/38; 356/39; 356/41; 356/101
(58) Field of Search ................................ 326/38–41, 47, 326/101

(56) References Cited

U.S. PATENT DOCUMENTS

2003/0128050 A1 * 7/2003 Schultz ........................ 326/41

* cited by examiner

*Primary Examiner*—Anh Q. Tran
(74) *Attorney, Agent, or Firm*—Yee & Associates, P.C.

(57) ABSTRACT

A pre-diffused high density array of core memory cells is provided in a metal programmable device. The peripheral logic is made up of gate array cells in the metal programmable device. The peripheral logic may be configured to access the core memory cells as various memory types, widths, depths, and other configurations. If the entire memory is not needed, then the unused memory cells can be used as logic gates. The application-specific circuit, including peripheral logic, memory interface logic, and memory configuration is programmed with a metal layer.

20 Claims, 4 Drawing Sheets

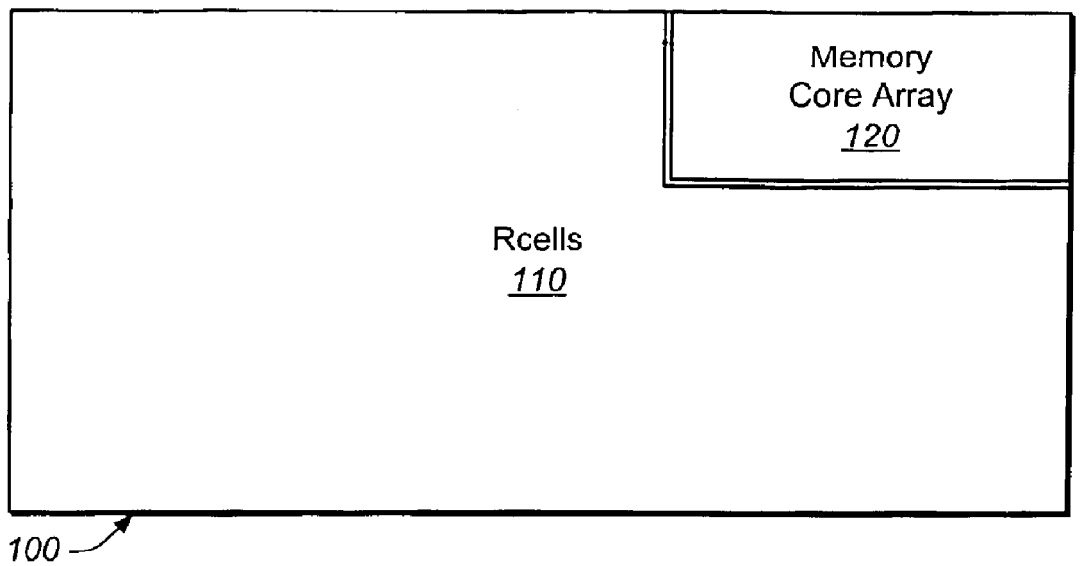
FIG._1
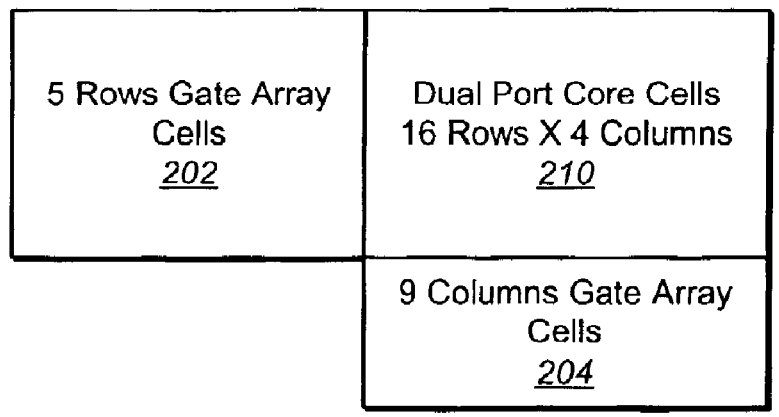
FIG._2

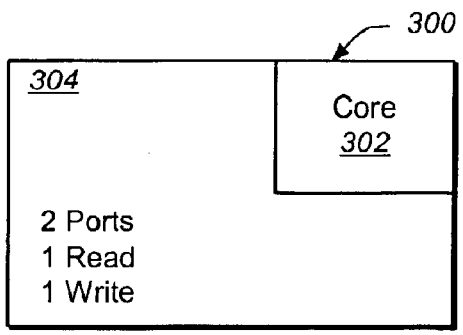
FIG._3A
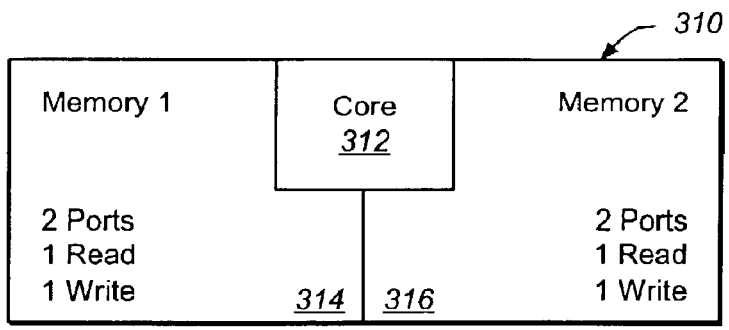
FIG._3B
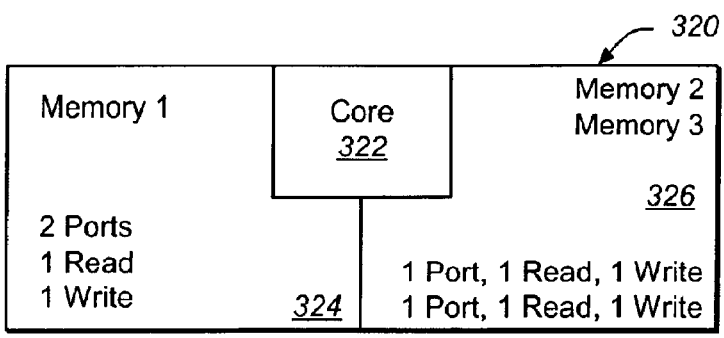
FIG._3C
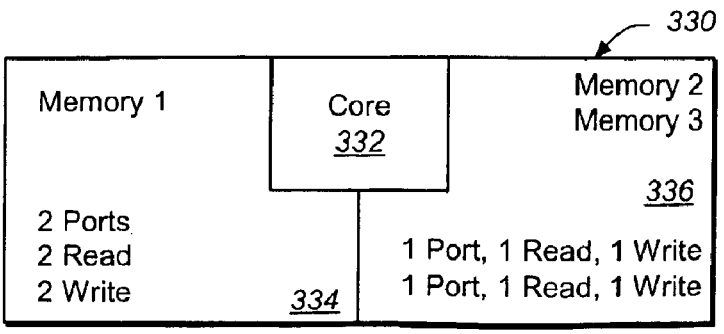
FIG._3D

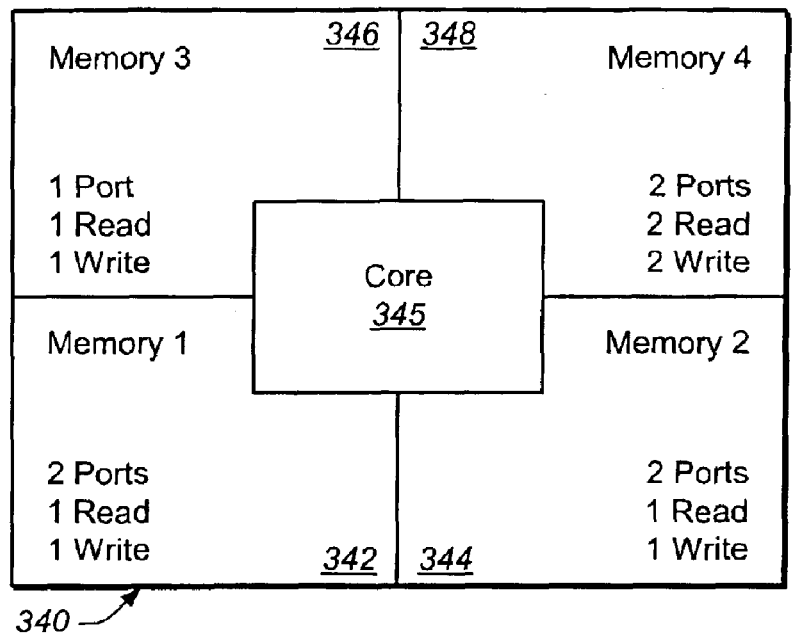
FIG._3E
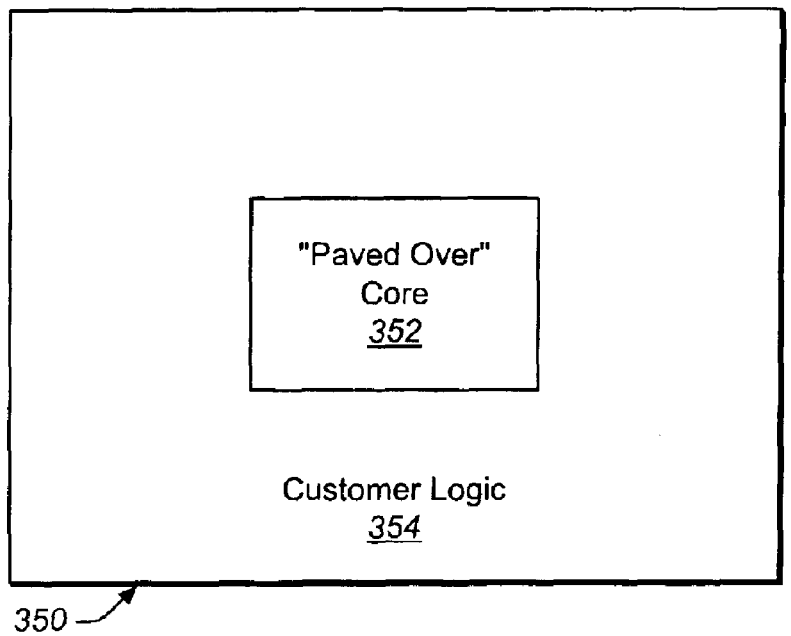
FIG._3F

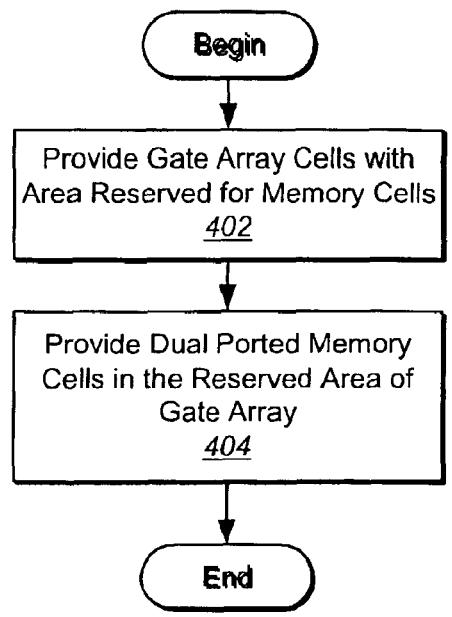
FIG._4
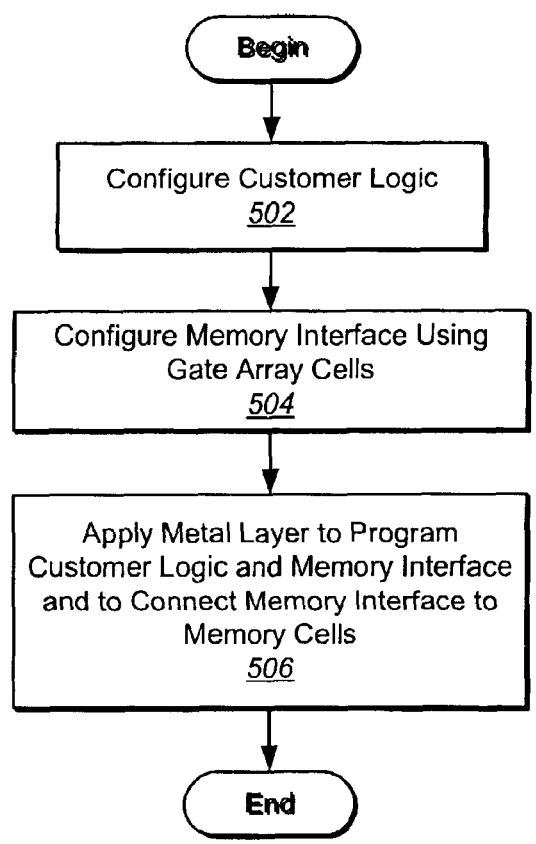
FIG._5

RECONFIGURABLE MEMORY ARCHITECTURE

BACKGROUND OF THE INVENTION

1. Technical Field

The present invention is directed generally toward metal programmable devices and, more particularly, to a method and apparatus for embedding a flexible memory core in metal programmable devices.

2. Description of the Related Art

In recent years, there has been a growth in products in which semi-custom techniques are used. Application-specific integrated circuits (ASIC) are widely used in consumer, manufacturing, communications, and amusement products, as well as other applications where a specific circuit may be needed. ASICs are very useful in bringing unique, customer-specific products to market on time.

The gate array is an example of an ASIC. Gate arrays are arrays of elements, such as AND or NAND gates, although today the term "gate array" usually refers to an array of transistors. These transistors can be tightly packed on an integrated circuit and later connected with a metal layer to form the application-specific circuit. These are referred to as metal programmable devices.

As gate array products became more sophisticated, it became necessary to form a memory in the circuit. Memory cells may be formed from the gate array transistors themselves. This approach is very flexible, because any number of memory cells of any type can be formed, within the area limitations in the gate array. However, each memory cell uses several transistors and a memory core may take up an undesirable amount of area and transistors in the gate array.

Another solution is to embed a memory in the gate array chip. Memory cells may be fabricated much more densely than memory cells formed from transistors in the gate array. Interface logic is also provided for the application-specific circuit to access the memory core. This solution allows much more memory to be provided in a smaller area. However, a fixed amount of memory is embedded in all gate array products. Thus, one application-specific circuit may require only a small amount of the embedded memory, in which case the remaining, unused area is wasted. Another application-specific circuit may require more embedded memory than is provided, in which case the circuit may not be possible with the gate array product. Furthermore, the type of memory is also fixed in the gate array product. Therefore, if a single port memory is provided and the application-specific circuit requires a dual port memory, it will not be possible to produce the application-specific circuit with the gate array product.

Therefore, it would be advantageous to provide large amounts of memory on a metal programmable device without sacrificing flexibility.

SUMMARY OF THE INVENTION

The present invention provides a pre-diffused high density array of core memory cells in a metal programmable device. The peripheral logic may be made up of gate array cells in the metal programmable device. The peripheral logic may be configured to access the core memory cells as various memory types, widths depths, and other configurations. If the entire memory is not needed, then the unused memory cells can be used as logic gates. The application-specific circuit, including peripheral logic, memory interface logic, and memory configuration is programmed with a metal layer.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a block diagram of an example metal programmable device in accordance with a preferred embodiment of the present invention;

FIG. 2 is a memory core with peripheral logic in accordance with a preferred embodiment of the present invention;

FIGS. 3A–3F are example metal programmable devices with various memory configurations in accordance with a preferred embodiment of the present invention;

FIG. 4 is a flowchart illustrating the operation of providing a metal programmable device with flexible embedded memory in accordance with a preferred embodiment of the present invention; and FIG. 5 shows a flowchart illustrating the operation of providing an application-specific circuit using the metal programmable device of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIG. 1, a block diagram of an example metal programmable device is depicted in accordance with a preferred embodiment of the present invention. Metal programmable device 100 includes gate array cells 110 and memory core array 120. An application-specific circuit can be formed by programming the gate array cells with a metal layer. This circuit may use the memory core array to store and retrieve data.

In accordance with a preferred embodiment of the present invention, the gate array is made up of "Rcells." Each Rcell is a five-transistor cell, which includes two NMOS and two PMOS devices, and one small PMOS device. The memory peripheral logic may be designed on other configurations of transistors as well. A memory designer should be able to design memory peripheral logic circuits using any type of gate array devices.

The peripheral logic for memory core array 120 may be formed from the gate array cells. Thus, the width/depth of the memory, the amount of memory, and the type of memory is configured by the programming of the peripheral logic. Some memory peripheral circuits may be pre-diffused on the device; however, while improving memory performance, this will decrease the amount of flexibility.

With reference to FIG. 2, a memory core with peripheral logic is shown in accordance with a preferred embodiment of the present invention. In this example, core cells 210 includes sixteen rows and four columns of memory cells. These core cells are dual port memory cells. The peripheral logic includes five rows of gate array cells 202 and nine columns of gate array cells 204. The peripheral logic is configured to access the memory core cells as dual port memory cells.

The core cells may be modified to make the interface with the gate array cells clean. The core cell size may be increased so that integer numbers of core cells and gate array cells line up naturally. In the example shown in FIG. 2, five rows of gate array cells line up with sixteen rows of memory core cells and nine columns of gate array cells line up with four columns of memory core cells.

With reference now to FIGS. 3A–3F, example metal programmable devices are shown with various memory configurations in accordance with a preferred embodiment of the present invention. More particularly, with reference to FIG. 3A, metal programmable device 300 includes memory core 302 and gate array cells 304. Some or all of the logic made up of gate array cells 304 accesses memory core 302. In this example, the peripheral logic, within gate array cells 304, is configured to access the memory core as a dual port memory with one read port and one write port. This is referred to as a "211" memory.

Turning now to FIG. 3B, metal programmable device 310 includes memory core 312, gate array cells 314, and gate array cells 316. Some or all of the logic made up of gate array cells 314 accesses a portion of the memory core 312, shown as "memory 1." Also, some or all of the logic made up of gate array cells 316 accesses another portion of the memory core, shown as "memory 2." In this example, the peripheral logic within gate array cells 314 is configured to access memory 1 as a dual port memory with one read port and one write port. Similarly, the peripheral logic within gate array cells 316 is configured to access memory 2 as a dual port memory with one read port and one write port.

Next, with reference to FIG. 3C, metal programmable device 320 includes memory core 322, gate array cells 324, and gate array cells 326. Some or all of the logic made up of gate array cells 324 accesses a first portion of the memory core 322, shown as "memory 1." A first portion of the logic made up of gate array cells 326 accesses a second portion of the memory core, shown as "memory 2." A second portion of the logic made up of gate array cells 326 also accesses a third portion of the memory core, referred to as "memory 3."

In this example, the peripheral logic within gate array cells 324 is configured to access memory 1 as a dual port memory with one read port and one write port. However, the peripheral logic within the first portion gate array cells 326 is configured to access memory 2 as a single port memory with one read port and one write port, while the peripheral logic within the second portion gate array cells 326 is configured to access memory 3 as a single port memory with one read port and one write port. This is referred to as "111" memory.

In a preferred embodiment of the present invention, memory core 322 is a dual ported memory. Thus, memory 2 and memory 3 may share common memory cells. In this case, the peripheral logic may be interleaved in order to access the two ports of the common memory cells. As such, the metal programmable device of the present invention provides a great deal of flexibility with an embedded memory core. While the examples shown here include a dual port memory core, the memory core may have fewer or more ports. For example, the memory core may include 16-port memory cells, although the peripheral circuitry and configuration become more cumbersome and unwieldy as the number of ports increases. Therefore, the preferred embodiment of the present invention includes a dual port memory core, which may be densely packed on the chip, while still providing the needed flexibility.

With reference now to FIG. 3D, metal programmable device 330 includes memory core 332, gate array cells 334, and gate array cells 336. Some or all of the logic made up of gate array cells 334 accesses a first portion of the memory core 332, shown as "memory 1." A first portion of the logic made up of gate array cells 336 accesses a second portion of the memory core, shown as "memory 2." A second portion of the logic made up of gate array cells 336 also accesses a third portion of the memory core, referred to as "memory 3."

In this example, the peripheral logic within gate array cells 334 is configured to access memory 1 as a dual port memory with two read ports and two write ports. This is referred to as "222" memory. However, the peripheral logic within the first portion gate array cells 336 is configured to access memory 2 as a single port memory with one read port and one write port, while the peripheral logic within the second portion gate array cells 336 is configured to access memory 3 as a single port memory with one read port and one write port.

Turning to FIG. 3E, metal programmable device 340 includes memory core 345, gate array cells 342, gate array cells 344, gate array cells 346, and gate array cells 348. Some or all of the logic made up of gate array cells 342 accesses a first portion of the memory core, shown as "memory 1," as a dual port memory with one read port and one write port. Some or all of the logic made up of gate array cells 344 accesses a second portion of the memory core, shown as "memory 2," as a dual port memory with one read port and one write port. Some or all of the logic made up of gate array cells 346 accesses a second portion of the memory core, shown as "memory 3," as a single port memory with one read port and one write port. Some or all of the logic made up of gate array cells 348 accesses a second portion of the memory core, shown as "memory 4," as a dual port memory with two read ports and two write ports.

In this example, the same memory core is capable of providing two 211 memory portions, a 111 memory portion, and a 222 memory portion. The same metal programmable device can be programmed with the customer logic and specialized memory configurations based on need, simply by applying the appropriate metal layer. A common memory core cell is an eight-transistor dual port core cell. However, there are many possible techniques for creating a dual port memory core cell. The configurable memory may also use other types of dual port core cells within the scope of the present invention.

With reference to FIG. 3F, metal programmable device 350 includes "paved over" memory core 352 and customer logic 354. A paved over memory core refers to a memory block with the metal connections removed, which allows chip-level routing tools to route over the block. This enables a designer to free up routing channels over blocks that are not being used.

FIG. 4 is a flowchart illustrating the operation of providing a metal programmable device with flexible embedded memory in accordance with a preferred embodiment of the present invention. The process begins and provides gate array cells with area reserved for embedded memory cells (step 402). Then, the process provides dual ported memory cells in the reserved area of the gate array (step 404) and the process ends.

Next, FIG. 5 shows a flowchart illustrating the operation of providing an application-specific circuit using the metal programmable device of the present invention. The process begins and configures the customer logic (step 502). Then, the process configures a memory interface using the gate array cells (step 504). Next, the process applies a metal layer to program the customer logic and memory interface and to connect the memory interface to the memory cells (step 506). Thereafter, the process ends.

Thus, the present invention solves the disadvantages of the prior art by providing a metal programmable device with an embedded memory that is configurable. By only embedding the core array, and not the peripheral interface logic, the width, depth, and type of the memory core is not fixed. Therefore, the memory can be configured to meet the needs of the customer logic. The present invention also preferably uses a dual ported memory core to increase flexibility. If the entire memory is not needed, then the unused memory cells can be used as logic gates.

What is claimed is:

1. A method for providing a metal programmable device, comprising:
   providing an array of programmable cells;
   providing an array of pre-diffused memory cells; and
   programming first peripheral interface logic using a first portion of the array of programmable cells, wherein the first peripheral interface logic accesses at least a first portion of the array of memory cells.

2. The method of claim 1, wherein the step of programming the first peripheral interface logic is performed by applying a metal layer to the array of programmable cells.

3. The method of claim 2, wherein the metal layer programs the first peripheral interface logic to access the first portion of the array of memory cells as dual port, one read, one write memory.

4. The method of claim 2, wherein the metal layer programs the first peripheral interface logic to access the first portion of the array of memory cells as dual port, two read, two write memory.

5. The method of claim 2, wherein the metal layer programs the first peripheral interface logic to access the first portion of the array of memory cells as single port, one read, one write memory.

6. The method of claim 1, further comprising:
   programming second peripheral interface logic using a second portion of the array of programmable cells, wherein the second peripheral interface logic accesses at least a second portion of the array of memory cells.

7. The method of claim 6, wherein the steps of programming the first peripheral interface logic and programming the second peripheral interface logic are performed by applying a metal layer to the array of programmable cells.

8. The method of claim 7, wherein the metal layer programs the first peripheral interface logic to access the first portion of the array of memory cells as a first type, wherein the metal layer programs the second peripheral interface logic to access the second portion of the array of memory cells as a second type, and wherein the first type and the second type are different.

9. The method of claim 1, wherein the array of pre-diffused memory cells is an array of dual port memory cells.

10. The method of claim 9, further comprising:
    programming second peripheral interface logic using the a second portion of the array of programmable cells, wherein the second peripheral interface logic accesses the first portion of the array of memory cells,
    wherein the metal layer programs the first peripheral interface logic to access the first portion of the array of memory cells as single port, one read, one write memory and programs the second peripheral interface logic to access the first portion of the array of memory cells as single port, one read, one write memory.

11. A metal programmable device, comprising:
    an array of programmable cells; and
    an array of pre-diffused memory cells,
    wherein the metal programmable device does not include pre-diffused peripheral interface logic for the array of memory cells.

12. The metal programmable device of claim 11, further comprising:
    a metal layer, wherein the metal layer programs first peripheral interface logic using a first portion of the array of programmable cells and wherein the first peripheral interface logic accesses at least a first portion of the array of memory cells.

13. The metal programmable device of claim 12, wherein the metal layer programs the first peripheral interface logic to access the first portion of the array of memory cells as dual port, one read, one write memory.

14. The metal programmable device of claim 12, wherein the metal layer programs the first peripheral interface logic to access the first portion of the array of memory cells as dual port, two read, two write memory.

15. The metal programmable device of claim 12, wherein the metal layer programs the first peripheral interface logic to access the first portion of the array of memory cells as single port, one read, one write memory.

16. The metal programmable device of claim 12, wherein the metal layer programs second peripheral interface logic using a second portion of the array of programmable cells and wherein the second peripheral interface logic accesses at least a second portion of the array of memory cells.

17. The metal programmable device of claim 16, wherein the metal layer programs the first peripheral interface logic to access the first portion of the array of memory cells as a first memory type, wherein the metal layer programs the second peripheral interface logic to access the second portion of the array of memory cells as a second memory type, and wherein the first memory type and the second memory type are different.

18. The metal programmable device of claim 12, wherein the metal layer includes routing channels that route over unused blocks within the array of pre-diffused memory cells.

19. The metal programmable device of claim 11, wherein the array of pre-diffused memory cells is an array of dual port memory cells.

20. The metal programmable device of claim 19, further comprising:
    a metal layer,
    wherein the metal layer programs first peripheral interface logic using a first portion of the array of programmable cells and wherein the first peripheral interface logic accesses at least a first portion of the array of memory cells;
    wherein the metal layer programs second peripheral interface logic using the a second portion of the array of programmable cells, wherein the second peripheral interface logic accesses the first portion of the array of memory cells; and
    wherein the metal layer programs the first peripheral interface logic to access the first portion of the array of memory cells as single port, one read, one write memory and programs the second peripheral interface logic to access the first portion of the array of memory cells as single port, one read, one write memory.

* * * * *